United States Patent [19]

Cliff et al.

[11] Patent Number: 5,001,368
[45] Date of Patent: Mar. 19, 1991

[54] CONFIGURABLE LOGIC ARRAY

[75] Inventors: Richard G. Cliff, Plymouth; Kenneth Austin, Cheshire, both of England

[73] Assignee: Pilkington Micro-Electronics Limited, St. Helens, England

[21] Appl. No.: 447,946

[22] Filed: Dec. 8, 1989

[30] Foreign Application Priority Data

Dec. 9, 1988 [GB] United Kingdom ............... 8828828

[51] Int. Cl.$^5$ ..................... G06F 7/38; H03K 17/16
[52] U.S. Cl. .................................. 307/465; 307/443;
307/451; 307/468; 307/469; 307/480; 307/242;
307/573; 307/576
[58] Field of Search ............... 309/443, 448, 451, 465,
309/468–469, 480, 242–243, 573, 576, 272.2

[56] References Cited

U.S. PATENT DOCUMENTS 4,642,487 2/1987 Carter ................................. 307/465
4,786,904 11/1988 Graham, III et al. .............. 307/465
4,812,678 3/1989 Abe ..................................... 307/465

FOREIGN PATENT DOCUMENTS 2180382 9/1986 United Kingdom .

Primary Examiner—Stanley D. Miller
Assistant Examiner—Margaret Rose Wambach
Attorney, Agent, or Firm—Sughrue, Mion, Zinn, Macpeak and Seas

[57] ABSTRACT

A semiconductor integrated circuit comprising a configurable logic circuit array which may be programmed to configure a plurality of NAND-gates in the array to preform various and different logic functions. An additional logic circuit is provided at each discrete site or cell, and is controllable to cause the additional logic circuit and the logic circuit to implement either a simple NAND logic function or a simple LATCH logic function.

20 Claims, 1 Drawing Sheet

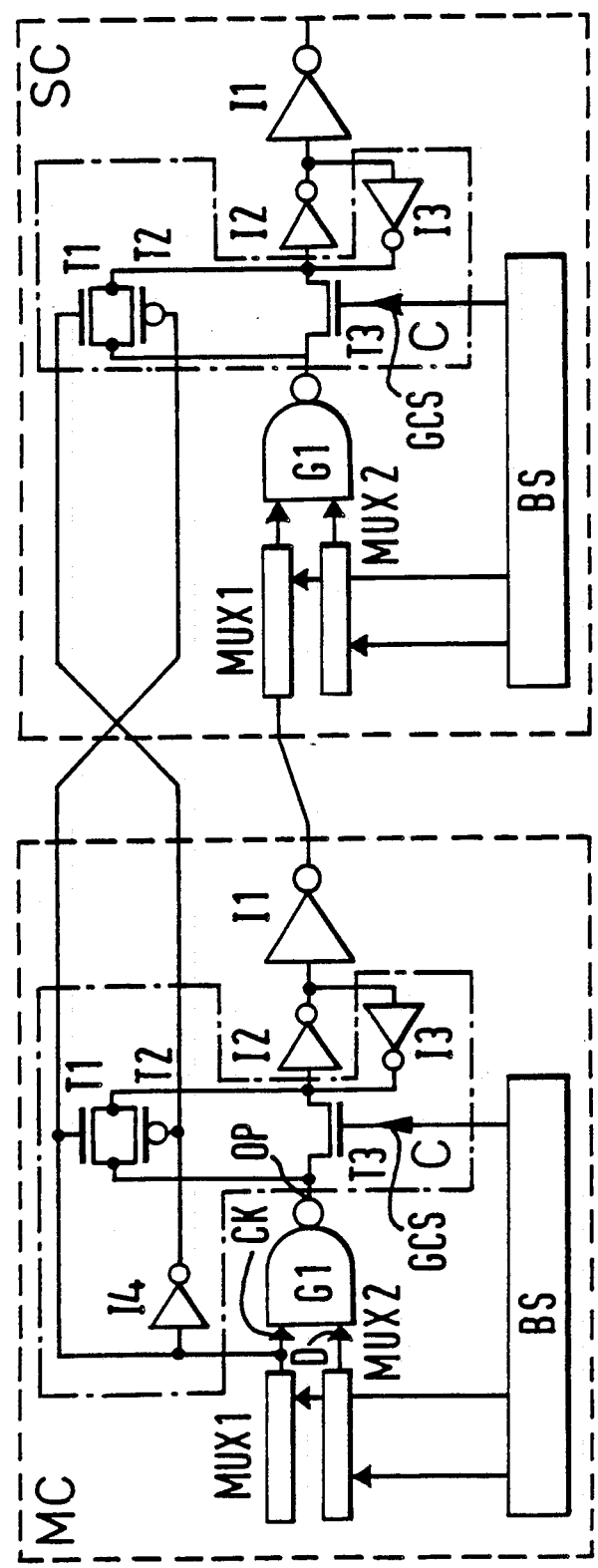

CONFIGURABLE LOGIC ARRAY

BACKGROUND OF THE INVENTION

The present invention relates to electronic integrated circuits of the type comprising configurable logic circuit arrays.

This invention finds particular utility in a configurable logic circuit array of the type as disclosed in our specification No. GB B-2180382 (the disclosure of which is incorporated herein by reference) in which the logic circuit array comprises a matrix of discrete sites or cells at each of which is a logic circuit which is adapted to perform a simple logic function. Typically the simple logic function is implemented by means of a two-input NAND gate.

An array of this type is capable of being programmed in such a manner as to configure the various NAND gates, as required, to perform various and different logic functions. One such function is known as a latching function and in the logic array as disclosed in specification No. GB B-2180382, a latching function may be implemented using four NAND gates.

This has the disadvantage that the greater number of latching functions that may be required from any logic array the fewer NAND gates remain for other required functions. This has the effect of reducing the overall effectiveness of the array.

An object of this invention is to overcome this disadvantage by providing an additional logic circuit for inclusion in each of the logic circuits at each discrete site to enable each site to have a greater programmable facility and thereby increase the overall utilization of the array.

SUMMARY OF THE INVENTION

According to the present invention there is provided a configurable semiconductor integrated circuit, comprises an area thereof formed both with a plurality of logic circuits at discrete sites respectively, each said circuit having a restricted simple logic function capability and only being capable of implementing a simple logic function and with a restricted signal translation system between inputs and outputs of the logic circuits affording direct connection paths each selectable as to its conduction state, those paths extending, for each said logic circuit, from its output to inputs of a first set of some of other said logic circuits and from its inputs to outputs of a second set of some of other said logic circuits, all of the sets (for all of the logic circuits) each being unique, characterised by the integrated circuit further comprises an additional logic circuit for each discrete site or cell, said additional logic circuit being so arranged within the logic circuit of the site or cell to be selectively controlled by control means to cause the logic circuit and additional logic circuit comprising the cell to operate as either a first or a second different simple logic function.

The additional logic circuit includes an inverter which is arranged in parallel and in back-to-back relationship with an inverter in the logic circuit within the cell to serve as a latching mechanism, a first switching means and a second switching means.

Preferably the first switching means is a transmission gate comprising first and second transistors, the transmission gate being controllable to closed and open operative states by signals input to the transmission gate from said logic circuit. The second switching means comprises a single transistor whose conduction state is controlled by the said control means.

Conveniently the control means is constituted by a gate control signal which when present causes the single transistor to be in a conduction state as a consequence of which the transmission gate becomes short circuited and inoperative and thereby the cell operates exclusively as a NAND gate function.

When the gate control signal is not present, the single transistor is caused to be in a non-conductive state enabling the transmission gate to be controlled to the open and closed operative states and the cell operates exclusively as a LATCH circuit function.

The logic circuit includes a logic gate circuit, and it is arranged that the signal transient time for an input signal to pass to the transmission gate is shorter than the transient time for the same signal to pass through the logic gate circuit to thereby effect rapid switching of the transmission gate between the closed to the open state.

A further aspect of this invention envisages the cascading of a plurality of individual cells which are configured for the LATCH circuit function to form a shift register.

The invention will be more readily understood from the following description of an exemplary embodiment which should be read in conjunction with the accompanying drawing.

BRIEF DESCRIPTION OF THE DRAWING

The drawing illustrates a schematic diagram of two interconnected logic circuits or cells each of which incorporates the additional logic circuit in accordance with this invention.

DESCRIPTION OF PREFERRED EMBODIMENT

Referring to the drawing, for convenience like components in each cell have been identically designated. The two cells shown are master MC and slave SC latch cells.

Each cell comprises a basic two-input NAND gate GI together with an output buffer I1 in the form of an inverter and a further inverter I2. Referring to the master cell MC, one of the inputs CK of the gate G1 carries clock signals from a multiplexer means MUXI to the cell while the other input D carries data signals from a further multiplexer means MUX2 to the cell.

An additional logic circuit C is interconnected between the NAND gate GI and the output buffer I1. By the utilization of control signals from a bit store BS, which also provides control signals for the multiplexers MUXI and MUX2, the additional logic circuit is arranged to change the NAND function of the cell into a LATCH circuit function.

The additional logic circuit comprises an additional inverter I3 which is connected in parallel and in back-to-back relationship with inverter I2 in the existing logic circuit and is so arranged to perform a latching mechanism. A further inverter I4 is included to invert the clock signals from input CK of cell MC to the transistor T2 of cell MC.

Two switching means are provided, the first comprises two transistors T1 and T2 of opposite polarity types connected in parallel to form a transmission gate, and the second a single transistor T3 serving as a simple switch.

In operation, selection of the cell (comprising the logic circuit together with the additional logic circuit) to operate either as a NAND gate function or as a LATCH function, is controlled by a gate control signal GCS which emanates from the bit store BS. When the signal GCS is present the transistor T3 is caused to conduct and the switch short circuits transistors T1 and T2 forming the transmission gate making it inoperative.

In these circumstances the cell operates as a NAND gate function exclusively. On the other hand when the signal GCS is not present, transistor T3 is non-conducting and transistors T1 and T2 are now controlled by the clock signals from the input CK of the NAND gate G1, being applied directly to transistor T1 on the one hand and through an inverter I4 to transistor T2 on the other hand, together with the prevailing output OP of the gate G1 itself to the transmission gate. The signals now passed by the transmission gate (T1+T2) from the output OP are effectively latched by the latching mechanism comprising inverters I2 and I3. In these circumstances the cell operates as a LATCH circuit function exclusively. The operation of the latching function and control of the transmission gate are summarised in the following table:

TABLE 1

| CK | D | OP | TRANSMISSION GATE (T1 + T2) |
|---|---|---|---|
| 1 | 1 | 0 | CLOSED |
| 0 | 0 | 1 | OPEN |
| 1 | 0 | 1 | CLOSED |
| 0 | 1 | 1 | OPEN |

When the input signal CK is at a binary one condition and the transmission gate is closed, the LATCH (I2 and I3) follows the data signal on input D. However, in order to prevent the signal stored in the latch being lost when the transmission gate is about to be opened the signals to the transmission gate must be fast enough to effect a change of state of the switch before the signal at the input of gate GI is effective at the LATCH (I2 +I3). Thus, a rapid switching of the LATCH (I2 +I3) is achieved as a consequence of the shorter signal transient times for signals to pass to the transmission gate than through the NAND gate G1 itself. In the utilization of this invention including cells operating in a latch mode as described herein and further interconnected in the manner of a shift register (two such stages being shown as master cell MC and slave cell SC), it is convenient to use the inverted output by way of the inverter I4 from a preceding cell to serve as an inverted clock input to the succeeding cell.

In such an arrangement, it will be apparent to those skilled in the art that using a number of latches cascaded together will form a suitable shift register which will not only give an increase in operating speed but will also contribute to a more effective use of the array itself.

What is claimed is:

1. A semiconductor integrated circuit including a configurable logic array formed on an area of said integrated circuit, said logic array comprising:
    a plurality of discrete sites;
    a plurality of logic circuits individual defined at each of said sites, each logic circuit only being capable of implementing a first simple logic function;
    wherein said plurality of logic circuits is divided into a multiplicity of unique sets of said logic circuits, each logic circuit having a conduction path extending between inputs thereof and outputs of one of said unique sets and a conduction path extending between said outputs and inputs of another of said unique sets, the conduction state of the conduction paths for each of the logic circuits being individually selectable so as to constitute a restricted signal translation system; and
    said logic array comprising, at each said discrete site, an additional logic circuit operable in combination with a logic circuit at that site to perform a second simple logic function, and selection means for selecting from said first and second logic functions the logic function to be implemented at that site.

2. An integrated circuit according to claim 1, wherein the first logic function is a NAND gate function and the second logic function is a LATCH function.

3. An integrated circuit according to claim 2, wherein a plurality of individual sites which are configured for the LATCH circuit function are cascaded to form a shift register.

4. An integrated circuit according to claim 1, wherein the logic circuit at each site comprises a logic gate (G1) and an inverter (I2) coupled to an output of said gate and wherein the additional logic circuit includes: a further inverter (I3) connected across said inverter in the logic circuit with the input of one inverter connected to the output of the other thereby to serve as a latching mechanism; a first switching means; and a second switching means.

5. An integrated circuit according to claim 4, wherein the first switching means is a transmission gate comprising first and second transistors (T1,T2), the transmission gate being controllable between closed and open operative states by signals input to the transmission gate from said logic gate.

6. An integrated circuit according to claim 4, wherein the second switching means comprises a single transistor (T3) whose conduction state is controlled by the said selection means.

7. An integrated circuit according to claim 6, wherein the selection means generates a gate control signal which when present causes the single transistor to be in a conduction state and short circuits the transmission gate whereby the first logic function is implemented.

8. An integrated circuit according to claim 7, wherein the first logic function is a NAND gate function and the second logic function is a LATCH function.

9. An integrated circuit according to claim 8, wherein a plurality of individual sites which are configured for the LATCH circuit function are cascaded to form a shift register.

10. An integrated circuit according to claim 5, wherein the second switching means comprises a single transistor whose conduction state is controlled by the said selection means.

11. An integrated circuit according to claim 10, wherein the selection means generates a gate control signal which, when not present, causes the single transistor to be in a non conducting state enabling the transmission gate to be controlled between open and closed operative states whereby the second logic function is implemented.

12. An integrated circuit according to claim 11, wherein the logic gate of each logic circuit is arranged such that the transient time for an input signal to pass to the transmission gate is shorter than the transient time for the same signal to pass through the logic gate to thereby effect rapid switching of the transmission gate between the closed and the open state.

13. An integrated circuit according to claim 11, wherein the first logic function is a NAND gate function and the second logic function is LATCH function.

14. An integrated circuit according to claim 10, wherein the selection means generates a gate control signal which when present causes the single transistor to be in a conduction state and short circuits the transmission gate whereby the first logic function is implemented.

15. An integrated circuit according to claim 14, wherein the first logic function is a NAND gate function and the second logic function is a LATCH function.

16. An integrated circuit according to claim 15, wherein a plurality of individual sites which are configured for the LATCH circuit function are cascaded to form a shift register.

17. An integrated circuit according to claim 6, wherein the selection means generates a gate control signal which, when not present, cases the single transistor to be in a non conducting state enabling the transmission gate to be controlled between open and closed operative states whereby the second logic function is implemented.

18. An integrated circuit according to claim 17, wherein the logic gate of each logic circuit is arranged such that the transient time for an input signal to pass to the transmission gate is shorter than the transient time for the same signal to pass through the logic gate to thereby effect rapid switching of the transmission gate between the closed and the open state.

19. An integrated circuit according to claim 17, wherein the first logic function is a NAND gate function and the second logic function is a LATCH function.

20. An integrated circuit according to claim 19, wherein a plurality of individual sites which are configured for the LATCH circuit function are cascaded to form a shift register.

* * * * *